(12) United States Patent
Ito et al.

(10) Patent No.: US 8,780,653 B2
(45) Date of Patent: Jul. 15, 2014

(54) SEMICONDUCTOR DEVICE HAVING SKEW DETECTION CIRCUIT MEASURING SKEW BETWEEN CLOCK SIGNAL AND DATA STROBE SIGNAL

(71) Applicant: Elpida Memory, Inc., Tokyo (JP)

(72) Inventors: Koji Ito, Tokyo (JP); Yoshinori Matsui, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/693,834

(22) Filed: Dec. 4, 2012

(65) Prior Publication Data

US 2013/0141994 A1    Jun. 6, 2013

(30) Foreign Application Priority Data

Dec. 5, 2011   (JP) ................................. 2011-265684

(51) Int. Cl.
*G11C 7/00*   (2006.01)

(52) U.S. Cl.
USPC ......................... 365/193; 365/194; 365/233.1

(58) Field of Classification Search
USPC ........................... 365/193, 194, 233.1, 189.05
See application file for complete search history.

(56) References Cited

U.S. PATENT DOCUMENTS

| | | | |
|---|---|---|---|
| 5,692,165 A | 11/1997 | Jeddeloh et al. | |
| 7,178,048 B2 | 2/2007 | Smith et al. | |
| 7,200,055 B2 * | 4/2007 | Ware et al. | 365/194 |
| 2010/0208535 A1 | 8/2010 | Fujisawa | |
| 2011/0115543 A1 | 5/2011 | Teramoto et al. | |

FOREIGN PATENT DOCUMENTS

| | | |
|---|---|---|
| JP | 10-069777 A | 3/1998 |
| JP | 2000-278103 A | 10/2000 |
| JP | 2010-192030 A | 9/2010 |
| JP | 2011-108300 A | 6/2011 |

* cited by examiner

*Primary Examiner* — David Lam
(74) *Attorney, Agent, or Firm* — Sughrue Mion, PLLC

(57) ABSTRACT

Disclosed herein is a semiconductor device that includes a clock terminal supplied with a first clock signal from outside; a dividing circuit dividing a frequency of the first clock signal to generate a plurality of second clock signals that are different in phase from one another; a multiplier circuit multiplying the second clock signals to generate a third clock signal, the multiplexer having a predetermined operating delay time; a data strobe terminal supplied with a first data strobe signal from outside; a strobe signal generation circuit adding the predetermined operating delay time to the first data strobe signal to generate a second data strobe signal; and a skew detection circuit measuring a skew between the third clock signal and the second data strobe signal.

14 Claims, 16 Drawing Sheets

SEMICONDUCTOR DEVICE HAVING SKEW DETECTION CIRCUIT MEASURING SKEW BETWEEN CLOCK SIGNAL AND DATA STROBE SIGNAL

BACKGROUND OF THE INVENTION

1. Field of the Invention

The present invention relates to a semiconductor device, and more particularly relates to a semiconductor device having a skew detection circuit measuring a skew between a clock signal and a data strobe signal.

2. Description of Related Art

Transmission and reception of read data and write data between a semiconductor memory device such as a DRAM (Dynamic Random Access Memory) and a memory controller may be performed synchronously with a data strobe signal. For example, in a write operation, a memory controller supplies a data strobe signal and write data to a semiconductor memory device, and the semiconductor memory device fetches the write data synchronously with the data strobe signal.

However, the write data fetched by the semiconductor memory device is transferred to a memory cell array synchronously with a clock signal, which is different from the data strobe signal. Therefore, when a skew exists between the data strobe signal and the clock signal, a write operation may not be performed correctly. To solve this problem, semiconductor memory devices often include a write leveling mode for measuring the skew between a clock signal and a data strobe signal (see Japanese Patent Application Laid-Open No. 2010-192030).

Upon entering a write leveling mode, a semiconductor memory device samples a clock signal at a timing of a rising edge of a data strobe signal supplied from a memory controller, and outputs the sampled clock signal from a data terminal. With this configuration, the memory controller can acquire an amount of skew between the data strobe signal and the clock signal. Consequently, the memory controller can adjust an output timing of the data strobe signal by taking the amount into consideration.

A semiconductor memory device disclosed in Japanese Patent Application Laid-Open No. 2010-192030 includes a DLL (Delay Locked Loop) circuit, which generates an internal clock signal that is phase-controlled. The read data are output in synchronism with the phase-controlled internal clock signal. However, the DLL circuit is a circuit block that consumes a relatively large amount of power. Therefore, the DLL circuit may not be provided in a semiconductor memory device for which low power consumption is required. In such a semiconductor memory device, read data which is parallel-to-serial converted by using an internal clock signal that is not phase controlled, and the read data is output to the outside without being phase-controlled. Even during a writing operation, the write data that have been input in synchronism with a data strobe signal are serial to parallel converted by using an internal clock signal that is not phase-controlled (See Japanese Patent Application Laid-Open No. 2011-108300). The parallel-to-serial conversion and the serial-to-parallel conversion are performed by using a plurality of frequency-divided clock signals, the phases of which are different from each other.

However, during the write leveling operation, the clock signal used needs to have the same frequency as an external clock signal, and the frequency-divided clock signals cannot be used. Therefore, in a semiconductor memory device having no DLL circuit, a plurality of frequency-divided clock signals are combined by a multiplier circuit, thereby reproducing an internal clock signal having the same frequency as the external clock signal. The internal clock signal needs to be used to perform the write leveling operation. Japanese Patent Application Laid-Open No. 2000-278103 discloses one example of the frequency dividing circuit and multiplier circuit.

However, if the internal clock signal is generated by the multiplier circuit, the delay caused by the multiplier circuit would be superimposed on the internal clock signal. As a result, the write leveling operation cannot be performed accurately. Such a phenomenon is not limited to the semiconductor memory devices such as DRAM. The phenomenon can occur in all semiconductor devices that transfer the write data using a plurality of frequency-divided clock signals and can perform the write leveling operation.

SUMMARY

In one embodiment, there is provided a semiconductor device that includes: a clock terminal supplied with a first clock signal from outside; a dividing circuit dividing a frequency of the first clock signal to generate a plurality of second clock signals that are different in phase from one another; a multiplier circuit multiplying the second clock signals to generate a third clock signal, the multiplexer having a predetermined operating delay time; a data strobe terminal supplied with a first data strobe signal from outside; a strobe signal generation circuit adding the predetermined operating delay time to the first data strobe signal to generate a second data strobe signal; and a skew detection circuit measuring a skew between the third clock signal and the second data strobe signal.

In another embodiment, there is provided a semiconductor device that includes: a strobe signal generation circuit supplied with a first data strobe signal to generate a second data strobe signal supplied from outside, the second data strobe signal is activated after elapse of a first period of time since the first data strobe signal that is supplied to the strobe signal generation circuit is activated; an input buffer circuit receiving a plurality of write data in serial from outside in synchronism with the second data strobe signal; a multiplier circuit that multiplies a plurality of first clock signals to generate a second clock signal, the second clock signal is activated after elapse of a second period of time since each of the first clock signals that is supplied to the multiplier circuit is activated; a serial-to-parallel conversion circuit that converts the write data that are output from the input buffer circuit in serial into parallel in synchronism with the first clock signals; and a skew detection circuit measuring a skew between the second clock signal and the second data strobe signal, wherein the second period of time is substantially the same as the first period of time.

In still another embodiment, there is provided a data processing system that includes: a first semiconductor device; and a second semiconductor device connected to the first semiconductor device. The first semiconductor device includes: a clock terminal supplied with a first clock signal from the second semiconductor device; a dividing circuit dividing a frequency of the first clock signal to generate a plurality of second clock signals that are different in phase from one another; a multiplier circuit multiplying the second clock signals to generate a third clock signal, the multiplexer having a predetermined operating delay time; a data strobe terminal supplied with a first data strobe signal from the second semiconductor device; a strobe signal generation circuit adding the predetermined operating delay time to the first data strobe signal to generate a second data strobe signal; and a skew detection circuit measuring a skew between the third clock signal and the second data strobe signal.

DETAILED DESCRIPTION OF THE EMBODIMENTS

One embodiment of the present invention will be described below. However, the claims of the present application are not limited to the embodiment. That is, according to one embodiment of the present invention, a semiconductor device includes: a multiplier circuit that multiplies a plurality of frequency-divided clock signals to generate an internal clock signal; an internal data strobe signal generation circuit that generates an internal data strobe signal based on an external data strobe signal; and a skew detection circuit that detects skew between the internal clock signal and the internal data strobe signal, wherein an amount of delay that the multiplier circuit has is substantially equal to an amount of delay that the internal data strobe signal generation circuit has. As a result, an offset of a write leveling operation that is attributable to the amount of delay by the multiplier circuit is cancelled. Therefore, the accurate write leveling operation is possible.

Figure 1:
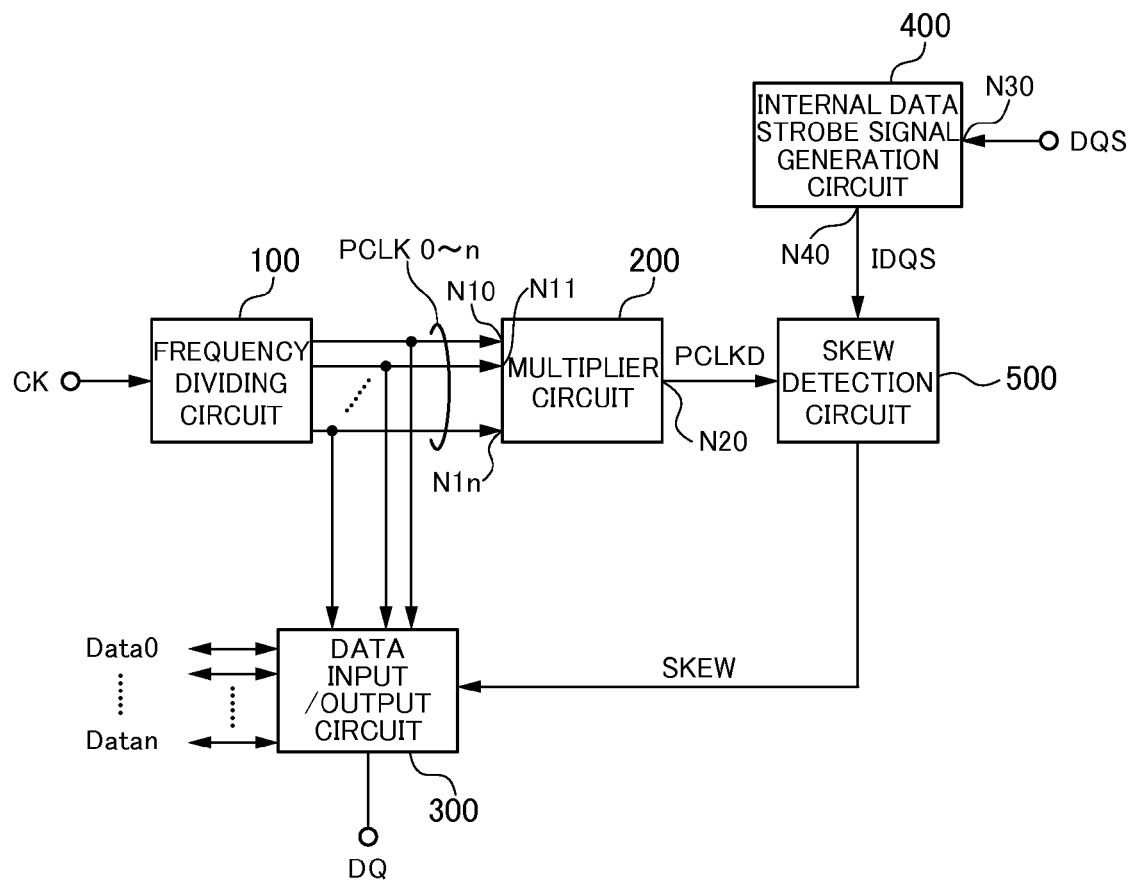
FIG. 1 is a block diagram indicative of a semiconductor device according to one embodiment of the present invention.

Referring now to FIG. 1, the semiconductor device includes a frequency dividing circuit 100, which divides the frequency of an external clock signal CK to generate a plurality of frequency-divided clock signals PCLK0 to PCLKn that are different in phase from each other; and a multiplier circuit 200, which multiplies a plurality of frequency-divided clock signals PCLK0 to PCLKn to generate an internal clock signal PCLKD. The frequency of the internal clock signal PCLKD generated by the multiplier circuit 200 is equal to the frequency of the external clock signal CK. The frequency-divided clock signals PCLK0 to PCLKn are supplied to a data input/output circuit 300. The data input/output circuit 300 performs parallel-serial conversion of read data sets Data0 to Datan in synchronism with the frequency-divided clock signals PCLK0 to PCLKn, and also performs serial-parallel conversion of write data DQ.

The internal clock signal PCLKD generated by the multiplier circuit 200 is supplied to a skew detection circuit 500. The skew detection circuit 500 detects skew between the internal clock signal PCLKD and an internal data strobe signal IDQS, and generates a skew detection signal SKEW. The skew detection signal SKEW is output to the outside via the data input/output circuit 300. The internal data strobe signal IDQS is generated by an internal data strobe signal generation circuit 400 on the basis of an external data strobe signal DQS.

An amount of delay that the internal data strobe signal generation circuit 400 has is so designed as to be substantially equal to an amount of delay that the multiplier circuit 200 has. As a result, a period of time from when edges of the frequency-divided clock signals PCLK0 to PCLKn are respectively input into a plurality of input nodes N10 to N1n of the multiplier circuit 200 until an edge of the internal clock signal PCLKD is output from an output node N20 of the multiplier circuit 200 is substantially equal to a period of time from when an edge of the external data strobe signal DQS is input into an input node N30 of the internal data strobe signal generation circuit 400 until an edge of the internal data strobe signal IDQS is output from an output node N40 of the internal data strobe signal generation circuit 400. Therefore, the skew detection circuit 500 can perform the write leveling operation in a state that an offset resulting from the delay of the multiplier circuit 200 is cancelled.

Figure 2:
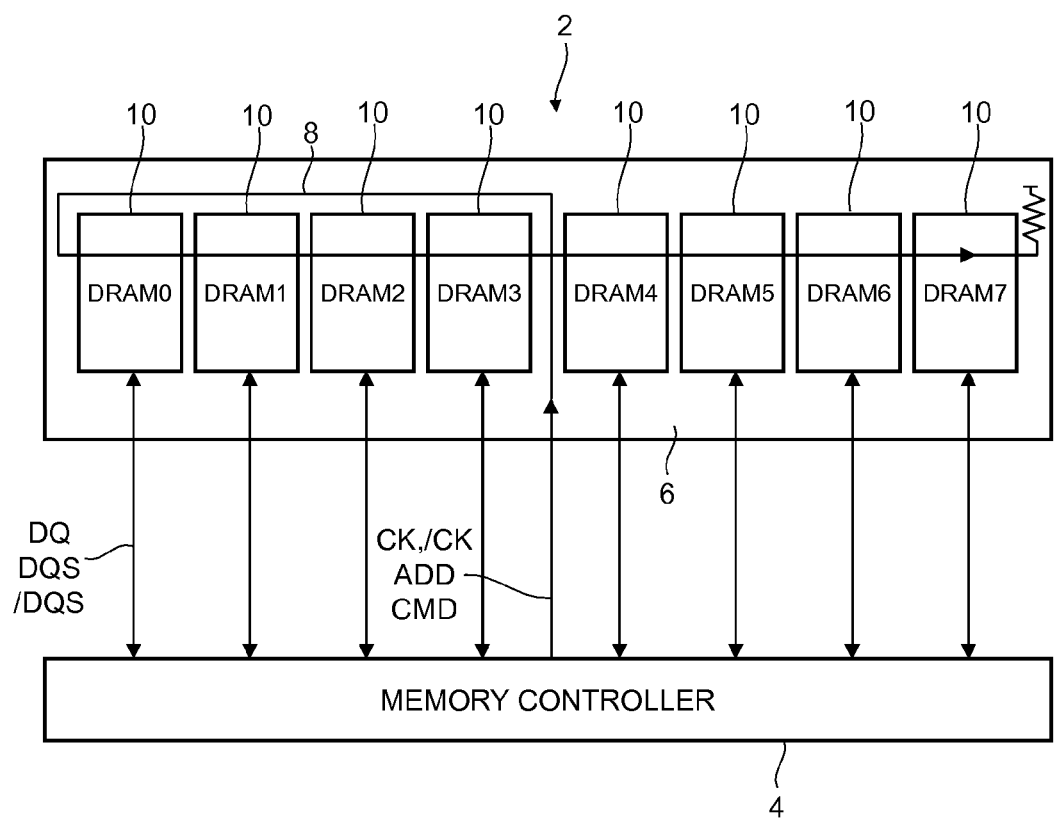
FIG. 2 is a diagram indicative of a configuration of a data processing system according to a preferred embodiment of the present invention.

Turning to FIG. 2, the data processing system includes a memory module 2 and a memory controller 4 connected to the memory module 2. The memory module 2 has plural semiconductor devices 10 (DRAM0 to DRAM7) mounted on a module substrate 6. While the memory module 2 shown in FIG. 2 has eight DRAMs of DRAM0 to DRAM7 on the module substrate 6, the number of the semiconductor devices 10 mounted on the module substrate 6 is not limited thereto. The semiconductor memory devices 10 can be mounted on either one side or both sides of the module substrate 6.

As shown in FIG. 2, data DQ (read data and write data) and data strobe signals DQS and /DQS are connected between the memory module 2 and the memory controller 4 in substantially equal lengths and also in a shortest distance, thereby achieving a high-speed data transfer. On the other hand, external clock signals CK and /CK, an address signal ADD, and a command signal CMD are flyby-connected by the same bus 8 provided on the module substrate 6. The flyby-connection means a so-called traversable connection. According to a flyby connection, the total wiring length and the number of wirings within the module substrate 6 can be reduced from those of an equidistance routing. Consequently, a layout constraint of the bus 8 can be relaxed, and a high-quality wiring layout can be achieved. As a result, a high-speed address-command transfer is achieved.

However, when the flyby system is used, a skew between the data strobe signal DQS and the clock signal CK becomes greatly different depending on a mounting position of the semiconductor devices 10 on the module substrate 6. In the example shown in FIG. 2, a skew is the smallest in the DRAM0 nearest from the memory controller 4, and a skew is the largest in the DRAM7 furthest from the memory controller 4. Therefore, in the DRAM1 to DRAM7, when the data strobe signal DQS is output to match the skew of the DRAM0, the clock signal CK is delayed from the data strobe signal DQS, and this delay becomes the largest in the DRAM7 On the other hand, in the DRAM0 to DRAM6, when the data strobe signal DQS is output to match the skew of the DRAM7, the clock signal CK becomes faster than the data strobe signal DQS, and this advance becomes the largest in the DRAM0.

Therefore, an output timing of the data strobe signal DQS needs to be adjusted for each of the DRAM0 to DRAM7. An operation of measuring an amount of skew necessary for this adjustment is "a write leveling operation". The memory controller 4 cyclically causes the DRAM0 to DRAM7 to enter the write leveling mode in the operation after the system startup in addition to a system start time, thereby periodically monitoring a skew which changes corresponding to the operating environment such as a temperature and a power source voltage and adjusting an output timing of the data strobe signal DQS.

When the DRAM0 to DRAM7 enter the write leveling mode, the DRAM0 to DRAM7 sample the external clock signal CK at a rising edge of the data strobe signal DQS supplied from the memory controller, and output it as data DQ from a data terminal. Accordingly, the memory controller 4 can acquire an amount of skew between the data strobe signal DQS and the clock signal CK, and can adjust an output timing of the data strobe signal DQS by considering the amount of skew.

Figure 3:
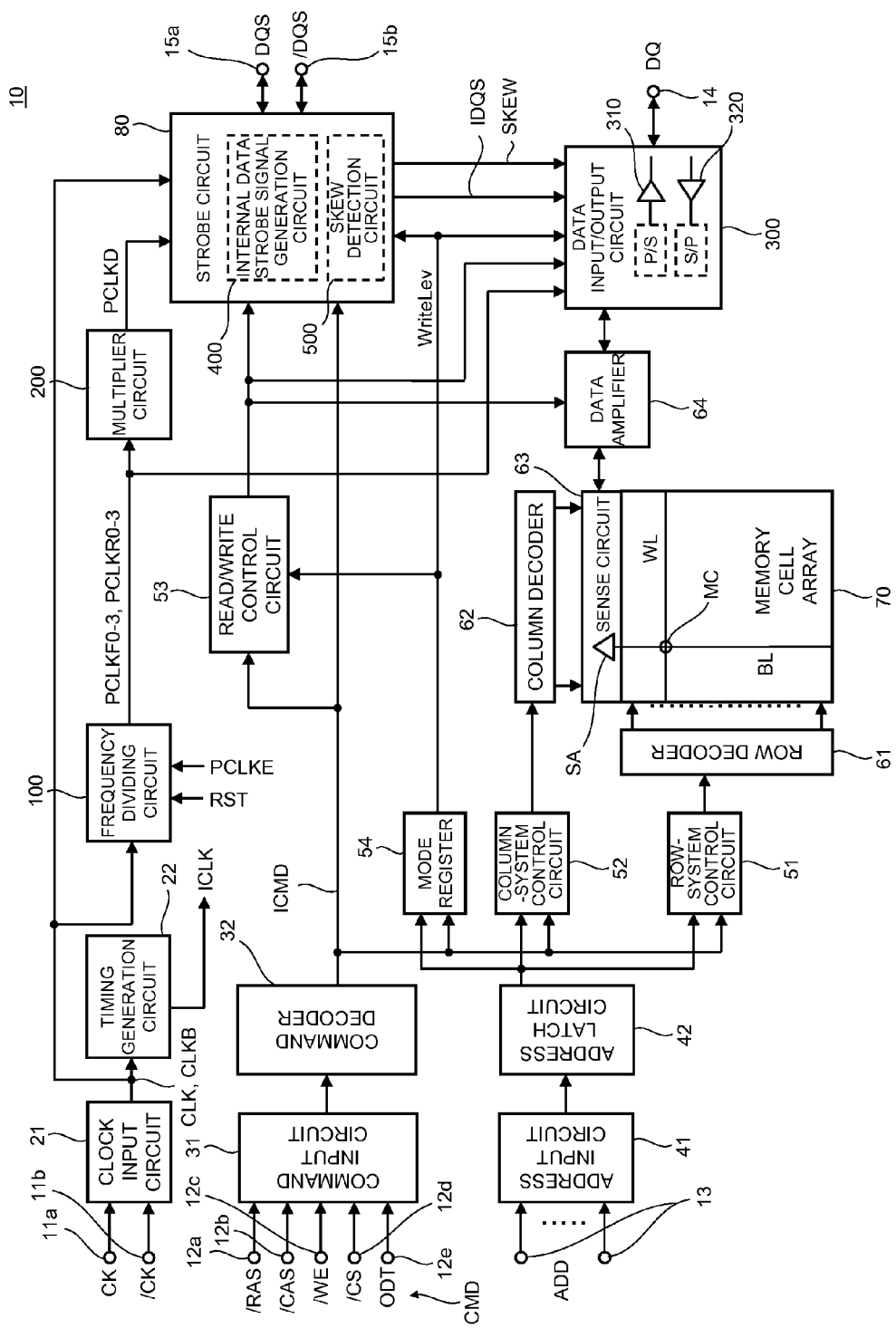
FIG. 3 is a block diagram indicative of a configuration of a semiconductor device according to an embodiment of the present invention.

Turning to FIG. 3, the semiconductor device 10 according to the present embodiment is a DRAM, and has external terminals that include clock terminals 11a and 11b, command terminals 12a to 12e, an address terminal 13, a data input/output terminal 14, and data strobe terminals 15a and 15b. While the semiconductor memory device 10 also includes a power source terminal or the like, these elements are not shown in FIG. 3.

The clock terminals 11a and 11b are supplied with external clock signals CK and /CK, respectively. The external clock signals CK and /CK are transferred to a clock input circuit 21. In the present specification, a signal whose name starts with "/" is an inverted signal of a corresponding signal or low-active signal. Accordingly, the external clock signals CK and /CK are complementary to each other. The same is true for a signal whose name ends with "B", which represents an inverted or low-active signal of a corresponding signal. A signal whose name ends with "N" is an inverted signal of a signal whose name ends with "T". Accordingly, the signal whose name ends with "T" is complementary to the signal whose name ends with "B".

The internal clock signals CLK and CLKB that are output from the clock input circuit 21 are supplied to a timing generation circuit 22 and the frequency dividing circuit 100. The phases of the internal clock signals CLK and CLKB substantially match the phases of the external clock signals CK and /CK. Therefore, according to the present embodiment, the internal clock signals CLK and CLKB and the external clock signals CK and /CK are sometimes treated as the same signals.

The timing generation circuit 22 generates various internal clocks ICLK, and supplies the clocks to various internal circuits. The frequency dividing circuit 100 divides the frequencies of the internal clock signals CLK and CLKB to generate eight phases of frequency-divided clock signal, PCLKF0 to PCLKF3 and PCLKR0 to PCLKR3, which are different in phase from each other. The frequency of the frequency-divided clock signals PCLKF0 to PCLKF3 and PCLKR0 to PCLKR3 is one-fourth of the frequency of the external clock signal CK; the phase therebetween is shifted by one-half of the clock cycle of the internal clock signals CLK and CLKB. The specific circuit configuration of the frequency dividing circuit 100 will be described later. According to the present embodiment, the eight phases of frequency-divided clock signal are generated by the frequency dividing circuit 100. However, the present invention is not limited to the above. The frequency-divided clock signals PCLKF0 to PCLKF3 and PCLKR0 to PCLKR3 are supplied to the data input/output circuit 300, as well as to the multiplier circuit 200.

The multiplier circuit 200 is a circuit that generates the internal clock signal PCLKD by multiplying the frequency-divided clock signals PCLKF0 to PCLKF3 and PCLKR0 to PCLKR3. The frequency of the internal clock signal PCLKD generated by the multiplier circuit 200 is equal to the frequency of the external clock signal CK. That is, the multiplier circuit 200 multiplies the frequency-divided clock signals PCLKF0 to PCLKF3 and PCLKR0 to PCLKR3, whose frequency has been divided by the frequency dividing circuit 100 so as to be one-fourth of the frequency of the external clock signal CK, to reproduce the internal clock signal PCLKD, the frequency of which is equal to the frequency of the external clock signal CK. The internal clock signal PCLKD is supplied to a strobe circuit 80, and is used for the write leveling operation. The specific circuit configuration of the multiplier circuit 200 will be described later.

The command terminals 12a to 12e are supplied with a row-address strobe signal /RAS, a column-address strobe signal /CAS, a write enable signal /WE, a chip select signal /CS, and the ODT signal. The command terminals 12a to 12e supply the received command signals CMD to a command input circuit 31. The command input circuit 31 supplies the received command signals CMD to a command decoder 32. The command decoder 32 holds, decodes, and counts the command signals synchronously with the internal clocks ICLK, thereby generating various internal commands ICMD. The generated internal commands ICMD are supplied to a row-system control circuit 51, a column-system control circuit 52, a read/write control circuit 53, and a mode register 54.

The address terminal 13 is supplied with the address signal ADD. The address terminal 13 supplies the received address signal ADD to an address input circuit 41. An output of the address input circuit 41 is supplied to an address latch circuit 42. The address latch circuit 42 latches the address signal ADD synchronously with the internal clocks ICLK. Out of the address signals ADD latched by the address latch circuit 42, a row address is supplied to the row-system control circuit 51, and a column address is supplied to the column-system control circuit 52. During an entry to a mode register set, the address signal ADD is supplied to the mode register 54, thereby changing the content of the mode register 54.

An output of the row-system control circuit 51 is supplied to a row decoder 61. The row decoder 61 selects any word line WL included in a memory cell array 70. Within the memory cell array 70, plural word lines WL and plural bit lines BL cross each other, and memory cells MC are arranged at intersections of these word lines and bit lines (FIG. 3 shows only one word line WL, one bit line BL, and one memory cell MC). The bit lines BL are connected to corresponding sense amplifiers SA included in a sense circuit 63.

An output of the column-system control circuit 52 is supplied to the column decoder 62. The column decoder 62 selects any sense amplifier SA in the sense circuit 63. The sense amplifier SA selected by the column decoder 62 is connected to a data amplifier 64. In a read operation, the data amplifier 64 further amplifies read data amplified by the sense circuit 63, and supplies the amplified read data to the data input/output circuit 300. On the other hand, in a write operation, the data amplifier 64 amplifies write data received from the data input/output circuit 300, and supplies this amplified write data to the sense circuit 63. The read/write control circuit 53 controls the data amplifier 64 and the data input/output circuit 300.

The data input/output terminal 14 is a terminal for outputting the read data DQ and inputting the write data DQ, and is connected to the data input/output circuit 300. The data input/output circuit 300 includes a parallel-to-serial conversion circuit P/S, a serial-to-parallel conversion circuit S/P, an output buffer circuit 310, and an input buffer circuit 320. During the reading operation, the read data that are supplied in a parallel form from the data amplifier 64 are converted by the parallel-to-serial conversion circuit P/S into a serial form. The read data DQ that have been converted into a serial form are output to the data input/output terminal 14 through the output buffer circuit 310. During the writing operation, the write data DQ that are supplied in a serial form to the data input/output terminal 14 are received by the input buffer circuit 320, and the received write data are converted by the serial-to-parallel conversion circuit S/P into a parallel form.

The parallel-to-serial conversion circuit P/S and the serial-to-parallel conversion circuit S/P operate in synchronism with the frequency-divided clock signals PCLKF0 to PCLKF3 and PCLKR0 to PCLKR3. The process by the input buffer circuit 320 of receiving the write data DQ is performed in synchronism with the internal data strobe signal IDQS. In a write leveling mode, the data input/output circuit 300 receives the skew detection signal SKEW, which is supplied from the strobe circuit 80, and outputs the skew detection signal SKEW in asynchronism with the frequency-divided clock signals PCLKF0 to PCLKF3 and PCLKR0 to PCLKR3.

The data strobe terminals 15a and 15b are terminals for inputting and outputting external data strobe signals DQS and /DQS, and are connected to the strobe circuit 80. As shown in FIG. 3, the strobe circuit 80 includes the internal data strobe signal generation circuit 400 and the skew detection circuit 500. The internal data strobe signal generation circuit 400 is a circuit that generates the internal data strobe signal IDQS on the basis of the external data strobe signal DQS. The skew detection circuit 500 is a circuit that detects, in a write leveling mode, the skew between the internal data strobe signal IDQS and the internal clock signal PCLKD. The skew detection signal SKEW that is output from the skew detection circuit 500 is supplied to the data input/output circuit 300. The specific circuit configuration of the internal data strobe signal generation circuit 400 and skew detection circuit 500 will be described later.

Figure 4:
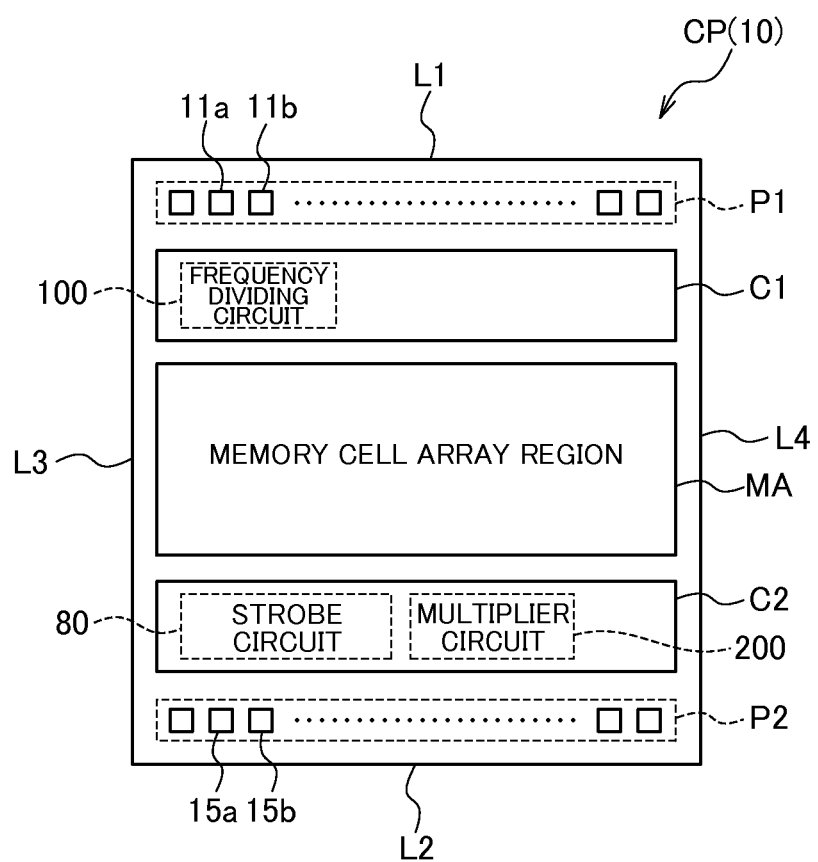
FIG. 4 is a plane view indicative of a layout of the semiconductor device shown in FIG. 3.

Turning to FIG. 4, the semiconductor device 10 of the present embodiment is integrated on one silicon chip CP. A principal surface of the silicon chip CP is in a square shape, and has first and second sides L1 and L2, which run parallel to each other, and third and fourth sides L3 and L4, which are perpendicular to the sides L1 and L2 and run parallel to each other. The semiconductor device 10 of the present embodiment includes a first pad region P1, which is provided along the first side L1, and a second pad region P2, which is provided along the second side L2. There are no pad regions along the third and fourth sides L3 and L4. The first and second pad regions P1 and P2 are regions where a plurality of external terminals are arranged. The first pad region P1 contains the clock terminals 11a and 11b. The second pad region P2 contains the data strobe terminals 15a and 15b.

The semiconductor device 10 of the present embodiment also includes a first peripheral circuit region C1, which is provided along the first pad region P1; a second peripheral circuit region C2, which is provided along the second pad region P2; and a memory cell array region MA, which is sandwiched between the first and second peripheral circuit regions C1 and C2. In the first peripheral circuit region C1, peripheral circuits related to the external terminals contained in the first pad region P1 are disposed. In the second peripheral circuit region C2, peripheral circuits related to the external terminals contained in the second pad region P2 are disposed. For example, in the first peripheral circuit region C1, the frequency dividing circuit 100 is disposed. In the second peripheral circuit region C2, the multiplier circuit 200 and the strobe circuit 80 are disposed.

Given the layout described above, if the external clock signals CK and /CK are supplied directly to the second peripheral circuit region C2, the dullness of the waveform increases due to a relatively large parasitic capacitance of a long-distance line. According to the method by which the skew is measured by supplying the external clock signals CK and /CK directly to the skew detection circuit 500, it is difficult to achieve a high level of measurement accuracy. Therefore, the semiconductor device 10 of the present embodiment uses the multiplier circuit 200 to generate the internal clock signal PCLKD, and supplies the internal clock signal PCLKD to the skew detection circuit 500 when the skew is measured.

Figure 5:
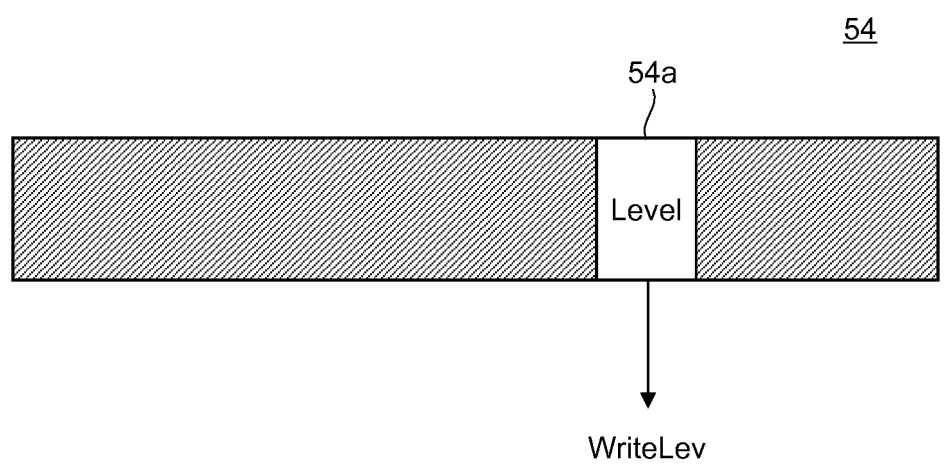
FIG. 5 is a diagram indicative of a portion of a mode register shown in FIG. 3.

Turning to FIG. 5, the mode register 54 includes at least a register 54a. The register 54a is a register that is used to enter the write leveling mode. More specifically, if the register 54a is set to "0", the "normal operation mode" starts. If the register 54a is set to "1", the "write leveling mode" starts. When the register 54a is set, a mode register set command is issued, and a signal of a logic level that should be set at a predetermined address terminal (e.g. the terminal A7) is supplied. The setting value of the register 54a is output as a write leveling signal WriteLev.

Figure 6:
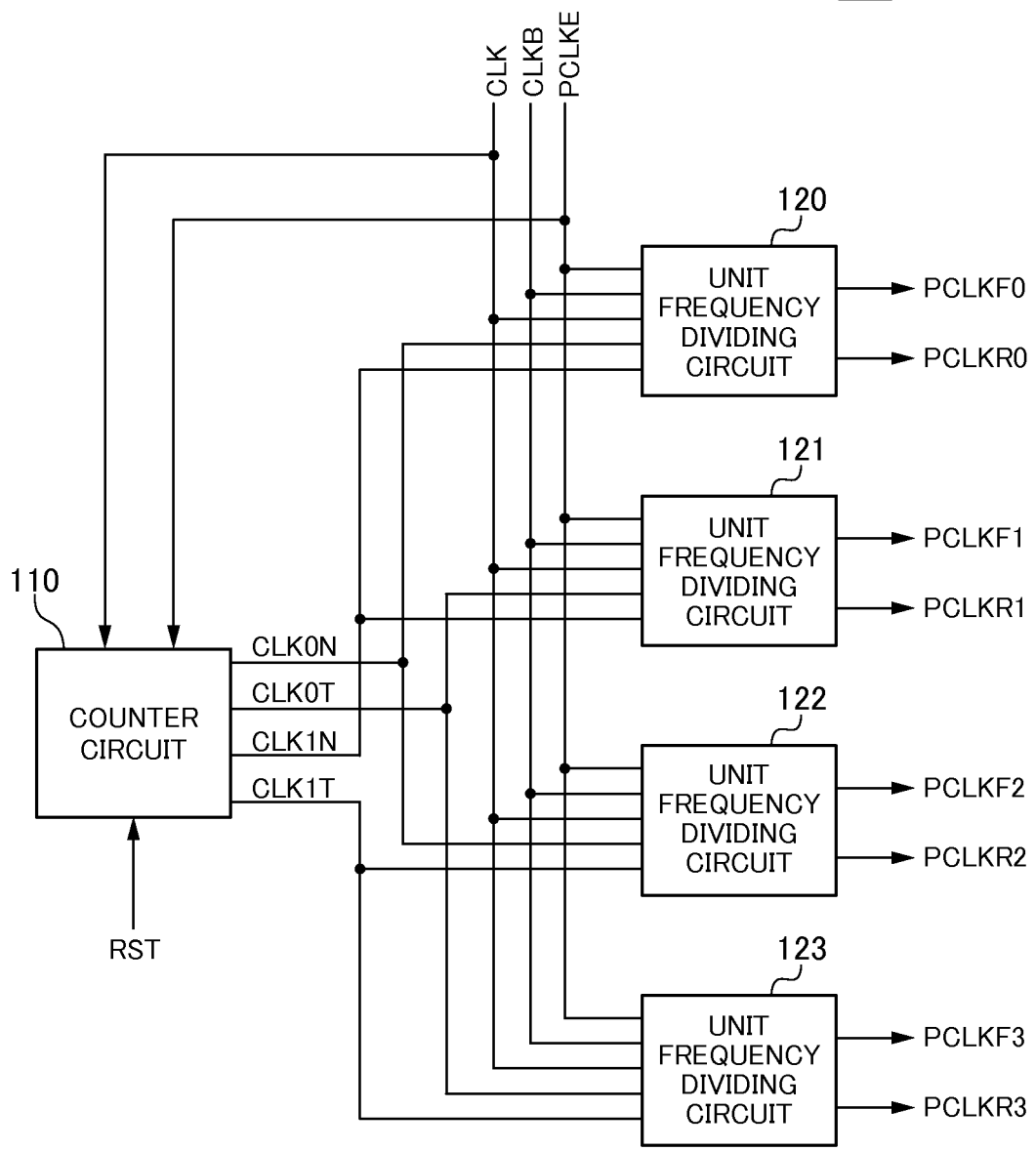
FIG. 6 is a block diagram indicative of a configuration of a frequency dividing circuit shown in FIG. 5.

Turning to FIG. 6, the frequency dividing circuit 100 includes a counter circuit 110 and four unit frequency dividing circuits 120 to 123. The counter circuit 110 is a circuit that generates count signals CLK0N, CLK0T, CLK1N, and CLK1T on the basis of the internal clock signal CLK. The unit frequency dividing circuits 120 to 123 are circuits that generate frequency-divided clock signals PCLKF0 to PCLKF3 and PCLKR0 to PCLKR3 on the basis of the internal clock signals CLK and CLKB and the corresponding count signals CLK0N, CLK0T, CLK1N, and CLK1T. The internal clock signals CLK and CLKB are supplied in common to the unit frequency dividing circuits 120 to 123. As for the count signals CLK0N, CLK0T, CLK1N, and CLK1T, the corresponding two signals are supplied to the unit frequency dividing circuits 120 to 123, respectively.

More specifically, the unit frequency dividing circuit 120 receives the count signals CLK0N and CLK1N, and generates the frequency-divided clock signals PCLKF0 and PCLKR0. The unit frequency dividing circuit 121 receives the count signals CLK0T and CLK1N, and generates the frequency-divided clock signals PCLKF1 and PCLKR1. The unit frequency dividing circuit 122 receives the count signals CLK0N and CLK1T, and generates the frequency-divided clock signals PCLKF2 and PCLKR2. The unit frequency dividing circuit 123 receives the count signals CLK0T and CLK1T, and generates the frequency-divided clock signals PCLKF3 and PCLKR3.

Figure 7:
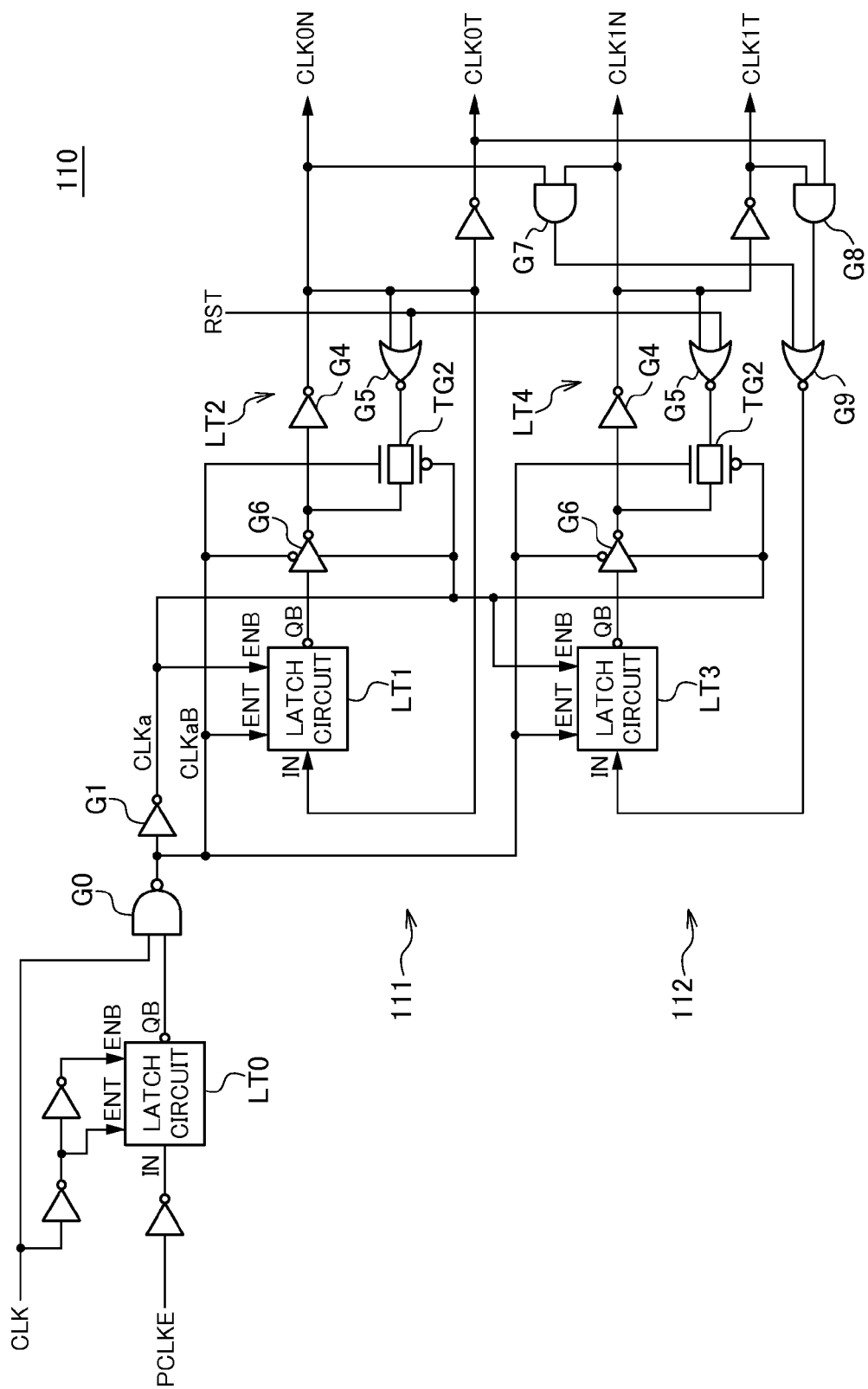
FIG. 7 is a circuit diagram indicative of a counter circuit shown in FIG. 6.

Turning to FIG. 7, the counter circuit 110 includes a NAND gate circuit G0, which generates an internal clock signal CLKaB on the basis of the internal clock signal CLK; and an inverter circuit G1, which generates an internal clock signal CLKa by inverting the internal clock signal CLKaB. To the other input node of the NAND gate circuit G0, an output signal of a latch circuit LT0 is supplied. The latch circuit LT0 is a circuit that receives the enable signal PCLKE. If the enable signal PCLKE is at a high level, the output of the latch circuit LT0, too, is fixed to a high level. Therefore, if the enable signal PCLKE is at a high level, the internal clock signal CLKa and the internal clock signal CLK are in-phase signals, and the internal clock signal CLKaB and the internal clock signal CLK are reversed phase signals.

Figure 8:
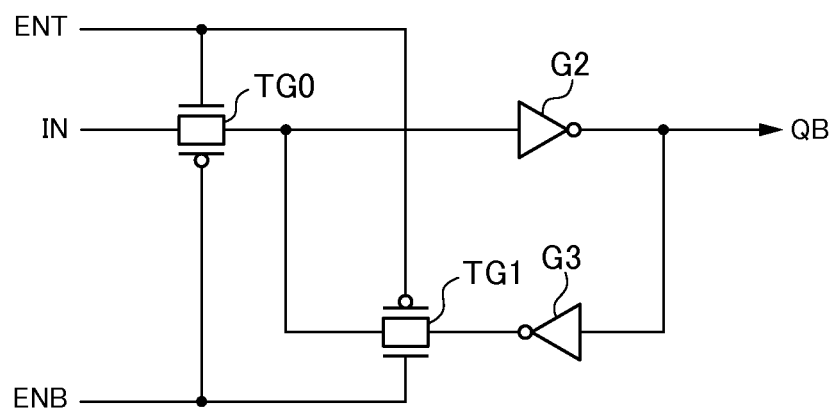
FIG. 8 is a circuit diagram indicative of a latch circuit shown in FIG. 7.

Turning to FIG. 8, the latch circuit LT0 includes two inverter circuits G2 and G3, which are circularly connected; a transfer gate circuit TG0, which is connected between an input node IN and an input node of the inverter circuit G2; and a transfer gate circuit TG1, which is connected between an output node of the inverter circuit G3 and the input node of the inverter circuit G2. One of the transfer gate circuits TG0 and TG1 is tuned ON based on the signals supplied to enable nodes ENT and ENB, while the other is turned OFF. As shown in FIG. 7, to the input node IN of the latch circuit LT0, the inverted enable signal PCLKE is supplied. To the enable nodes ENT and ENB of the latch circuit LT0, the internal clock signal CLK and the inverted signal thereof are supplied.

Returning to FIG. 7, the internal clock signals CLKa and CLKaB are supplied to a bit output circuit 111, which contains latch circuits LT1 and LT2, as well as to a bit output circuit 112, which contains latch circuits LT3 and LT4. The latch circuits LT1 and LT3 have the same circuit configuration as the latch circuit LT0 shown in FIG. 8.

The bit output circuit 111 is so formed that the latch circuits LT1 and LT2 are circularly connected. Therefore, the count signals CLK0N and CLK0T that are output from the bit output circuit 111 become inverted for each cycle of the internal clock signal CLK. More specifically, the latch circuit LT2 is so formed that an inverter circuit G4 and a NOR gate circuit G5 are circularly connected. Between an output node of the NOR gate circuit G5 and an input node of the inverter circuit G4, a transfer gate circuit TG2 is connected. The transfer gate circuit TG2 is turned ON or OFF in synchronism with the internal clock signals CLKa and CLKaB. To the other input node of the NOR gate circuit, a reset signal RST is supplied. When the reset signal RST is activated to a high level, the count signals CLK0N and CLK0T are initialized to a high and a low level, respectively. Between the latch circuit LT1 and the latch circuit LT2, a clocked inverter circuit G6, which becomes activated in synchronism with the internal clock signals CLKa and CLKaB, is connected. According to the above configuration, if the input clock signal CLK is input after the reset signal RST is deactivated to a low level, the logic levels of the count signals CLK0N and CLK0T are inverted every clock cycle.

The bit output circuit 112 basically has the same circuit configuration as the bit output circuit 111. However, the signal that is fed back to the latch circuit LT3 is different from the corresponding signal of the bit output circuit 111. In the bit output circuit 112, an output signal of a NOR gate circuit G9 is fed back to the latch circuit LT3. To the NOR gate circuit G9, the following signals are supplied: an output of a NAND gate circuit G7 that receives the count signals CLK0N and CLK1N; and an output of a NAND gate circuit G8 that receives the count signals CLK0T and CLK1T. Therefore, if the input clock signal CLK is input after the reset signal RST is deactivated to a low level, the logic levels of the count signals CLK1N and CLK1T are inverted every two clock cycles.

The counter circuit 110 has the above-described circuit configuration. According to the configuration, the counter circuit 110 updates a binary signal, whose low-order bit is the count signal CLK0N (CLK0T) and whose high-order bit is the count signal CLK1N (CLK1T), every clock cycle of the internal clock signal CLK. The count signals CLK0N, CLK0T, CLK1N, and CLK1T that are generated as described above are supplied to the unit frequency dividing circuits 120 to 123 as shown in FIG. 6.

Figure 9:
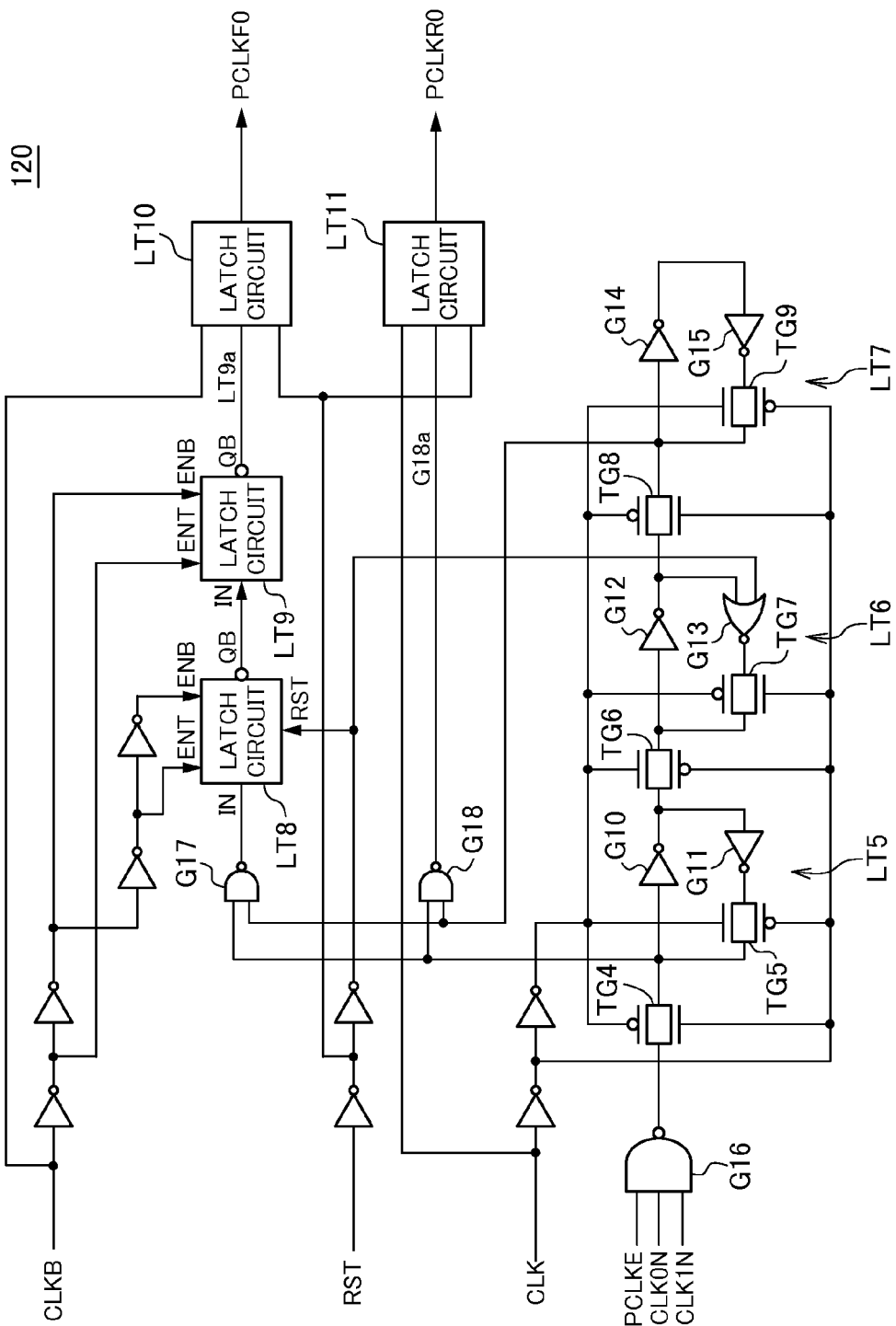
FIG. 9 is a circuit diagram indicative of a unit frequency dividing circuit shown in FIG. 6.

Turning to FIG. 9, the unit frequency dividing circuit 120 has three latch circuits LT5 to LT7, which are connected in cascade. The latch circuit LT5 is so formed that inverter circuits G10 and G11 are circularly connected. Between an output node of the inverter circuit G11 and an input node of the inverter circuit G10, a transfer gate circuit TG5 is connected. A signal that is input into the latch circuit LT5 is supplied from a three-input NAND gate circuit G16 via a transfer gate circuit TG4. The signals that are input into the NAND gate circuit G16 include the enable signal PCLKE and the count signals CLK0N and CLK1N.

The latch circuit LT6 is so formed that an inverter circuit G12 and a NOR gate circuit G13 are circularly connected. Between an output node of the NOR gate circuit G13 and an input node of the inverter circuit G12, a transfer gate circuit TG7 is connected. To the other input node of the NOR gate circuit G13, the reset signal RST is supplied. A signal that is input into the latch circuit LT6 is supplied from the previous-stage latch circuit LT5 via a transfer gate circuit TG6.

The latch circuit LT7 is so formed that inverter circuits G14 and G15 are circularly connected. Between an output node of the inverter circuit G15 and an input node of the inverter circuit G14, a transfer gate circuit TG9 is connected. A signal that is input into the latch circuit LT7 is supplied from the previous-stage latch circuit LT6 via a transfer gate circuit TG8.

The transfer gate circuits TG4 to TG9 are turned ON or OFF on the basis of the clock signal CLK. The transfer gate circuits TG4, TG7, and TG8 are commonly controlled. The transfer gate circuits TG5, TG6, and TG9 are commonly controlled. The operation of the transfer gate circuits TG4, TG7, and TG8 are complementary to the operation of the transfer gate circuits TG5, TG6, and TG9. That is, when one group is turned ON, the other is turned OFF. According to the above configuration, the three latch circuits LT5 to LT7 that are connected in cascade perform a shift operation in synchronism with the clock signal CLK. As described above, a signal that is input into the first-stage latch circuit LT5 is provided by the NAND gate circuit G16. The output of the NAND gate circuit G16 is activated to a low level once in every four clock cycles.

The outputs of the latch circuits LT5 and LT7 are supplied to the NAND gate circuits G17 and G18. An output signal of the NAND gate circuit G17 is supplied to the first-stage latch circuit LT8, which is one of the three latch circuits LT8 to LT10 connected in cascade. The output signal of the NAND gate circuit G18 is supplied to a latch circuit LT11.

Figure 10:
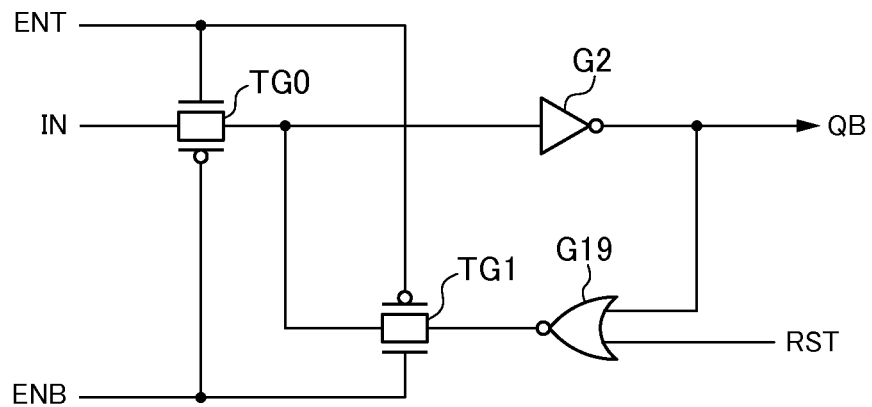
FIG. 10 is a circuit diagram indicative of a latch circuit LT8 shown in FIG. 9.

Turning to FIG. 10, the latch circuit LT8 is made by replacing the inverter circuit G3 of the latch circuit LT0 shown in FIG. 8 with a NOR gate circuit G19. The configurations of the other circuits are the same as that of the latch circuit LT0 shown in FIG. 8. To the other input node of the NOR gate circuit G19, the reset signal RST is supplied. As shown in FIG. 9, an output signal of the latch circuit LT8 is supplied to the latch circuit LT9. The latch circuit LT9 has the same circuit configuration as the latch circuit LT0 shown in FIG. 8.

Figure 11:
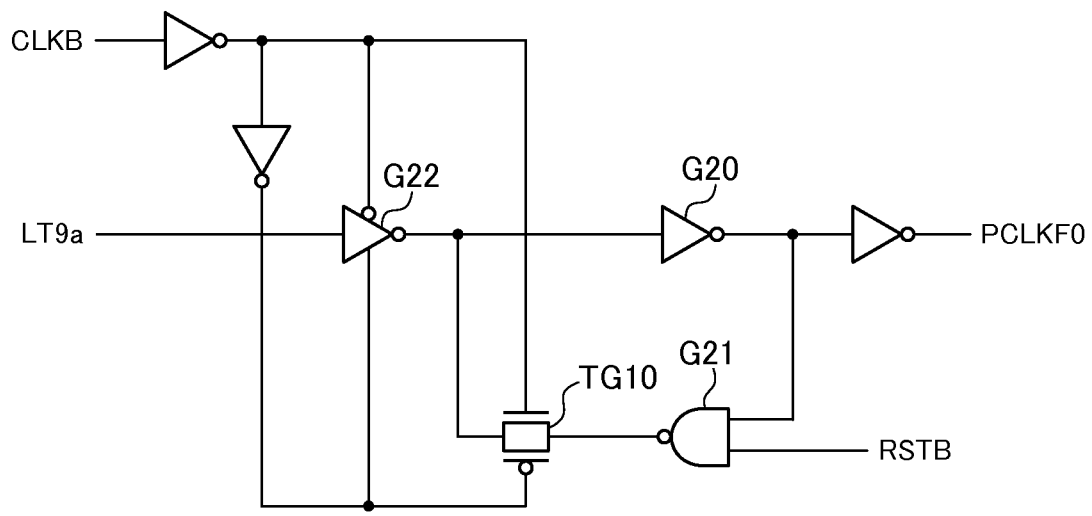
FIG. 11 is a circuit diagram indicative of a latch circuit LT10 shown in FIG. 8.

Turning to FIG. 11, the latch circuit LT10 includes an inverter circuit G20 and an NAND gate circuit G21, which are circularly connected. Between an output node of the NAND gate circuit G21 and an input node of the inverter circuit G20, a transfer gate circuit TG10 is connected. To the other input node of the NAND gate circuit G21, the inverted reset signal RSTB is supplied. To an input node of the inverter circuit G20, an output signal LT9a of the latch circuit LT9 is supplied via a clocked inverter circuit G22. The clocked inverter circuit G22 and the transfer gate circuit TG10 are exclusively activated based on the internal clock signal CLKB.

The latch circuit LT11 basically has the same circuit configuration as the latch circuit LT10 shown in FIG. 11. The latch circuit LT11 is different from the latch circuit LT10 in that, instead of the clock signal CLKB, the clock signal CLK is supplied, and that, instead of the output signal LT9a, the output signal G18a of the NAND gate circuit G18 is supplied.

The outputs of the latch circuits LT10 and LT11 are used as the frequency-divided clock signals PCLKF0 and PCLKR0. The other unit frequency dividing circuits 121 to 123 have the same circuit configuration as the unit frequency dividing circuit 120 shown in FIG. 9 except that combinations of count signals CLK0N, CLK0T, CLK1N, and CLK1T that are supplied to the NAND gate circuit G16 are different.

Figure 12:
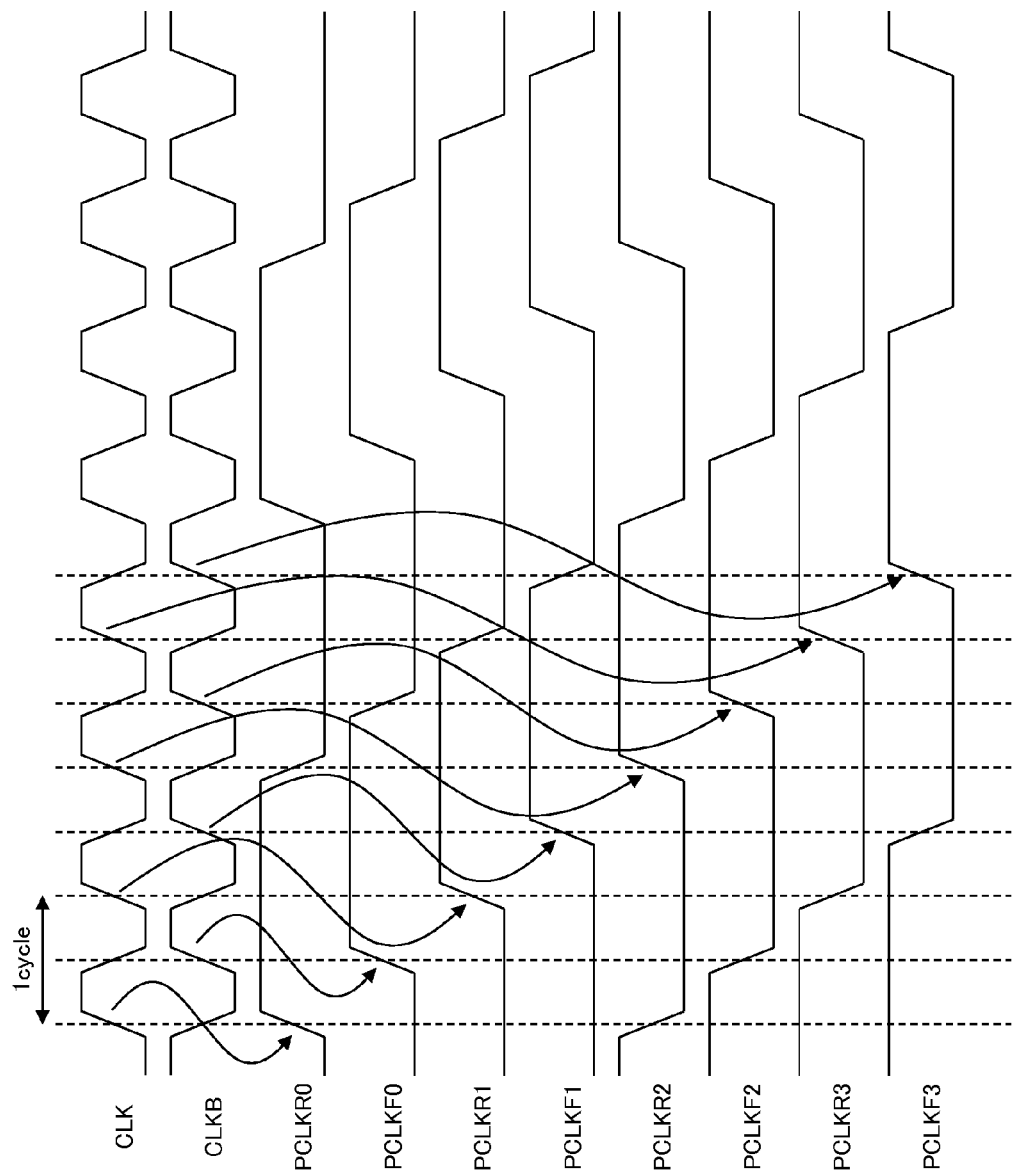
FIG. 12 is a waveform chart indicative of an operation of the frequency dividing circuit shown in FIG. 6.

Turning to FIG. 12, the frequency of the frequency-divided clock signals PCLKF0 to PCLKF3 and PCLKR0 to PCLKR3 is one-fourth of the frequency of the internal clock signals CLK and CLKB; the phase therebetween is shifted by one-half of the clock cycle of the internal clock signals CLK and CLKB. The frequency-divided clock signals PCLKF0 to PCLKF3 and PCLKR0 to PCLKR3 are supplied to the data input/output circuit 300 shown in FIG. 3. As described above, the data input/output circuit 300 includes the parallel-to-serial conversion circuit P/S and the serial-to-parallel conversion circuit S/P. Therefore, during the reading operation, the parallel-to-serial conversion is performed in synchronism with the frequency-divided clock signals PCLKF0 to PCLKF3 and PCLKR0 to PCLKR3. During the writing operation, the serial-to-parallel conversion is performed in synchronism with the frequency-divided clock signals PCLKF0 to PCLKF3 and PCLKR0 to PCLKR3.

Figure 13:
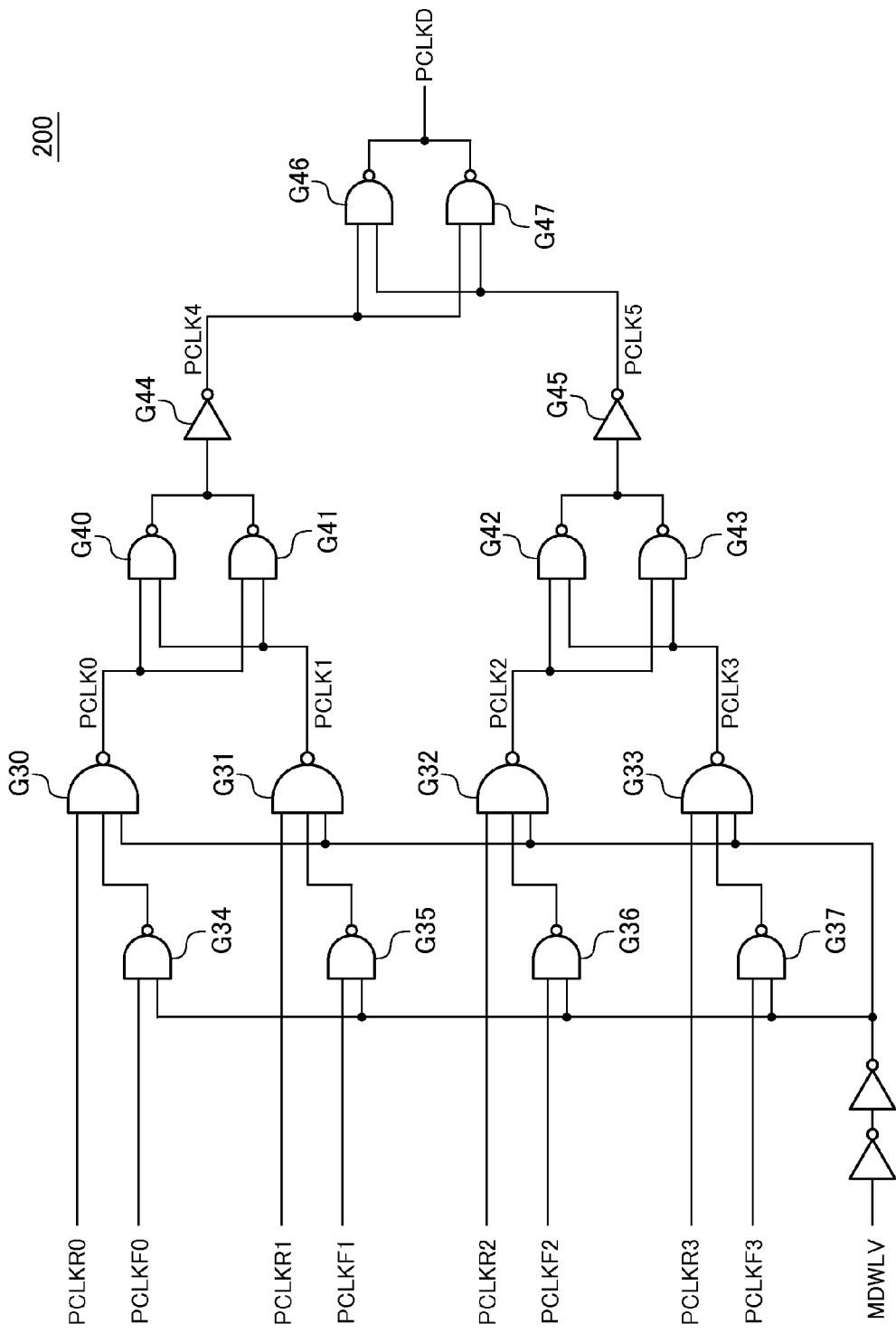
FIG. 13 is a circuit diagram indicative of an embodiment of a multiplier circuit shown in FIG. 3.

Turning to FIG. 13, the multiplier circuit 200 includes a NAND gate circuit G30, which combines the frequency-divided clock signals PCLKF0 and PCLKR0 to generate the internal clock signal PCLK0; a NAND gate circuit G31, which combines the frequency-divided clock signals PCLKF1 and PCLKR1 to generate the internal clock signal PCLK1; a NAND gate circuit G32, which combines the frequency-divided clock signals PCLKF2 and PCLKR2 to generate the internal clock signal PCLK2; and a NAND gate circuit G33, which combines the frequency-divided clock signals PCLKF3 and PCLKR3 to generate the internal clock signal PCLK3.

Figure 14:
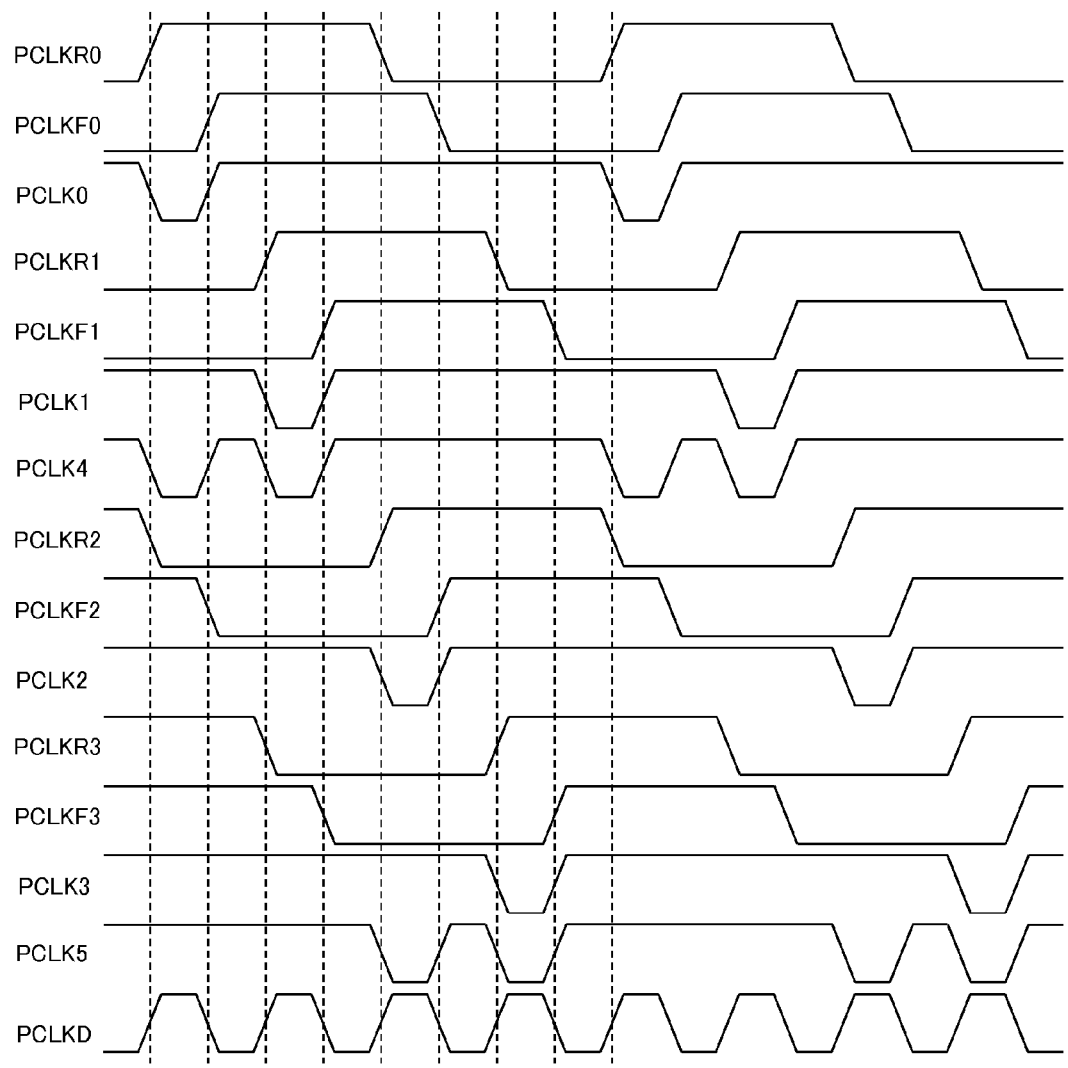
FIG. 14 is a waveform chart indicative of an operation of the multiplier circuit shown in FIG. 13.

The NAND gate circuit G30 is a three-input NAND gate circuit. To the first input node, the frequency-divided clock signal PCLKR0 is supplied. To the second input node, an output signal of a NAND gate circuit G34 is supplied. To the third input node, an enable signal MDWLV is supplied. The NAND gate circuit G34 is a two-input NAND gate circuit. To one of the input nodes, the frequency-divided clock signal PCLKF0 is supplied. To the other input node, the enable signal MDWLV is supplied. According to the above configuration, as shown in FIG. 14, which is a waveform chart, only during a period of time when the internal clock signal PCLKR0 is at a high level and the internal clock signal PCLKF0 at a low level, the internal clock signal PCLK0 is at a low level. During the other periods, the logic level of the internal clock signal PCLK0 remains at a high level. The phase shift between the internal clock signals PCLKR0 and PCLKF0 is one-half of the clock cycle of the internal clock signal CLK. Therefore, the period when the internal clock signal PCLK0 is at a low level is the period of the ½ clock cycle of the internal clock signal CLK. The period appears every four clock cycles of the internal clock signal CLK.

The same is true for the other NAND gate circuits G31 to G33. The waveforms of the internal clock signals PCLK1 to PCLK3 generated are the same as shown in FIG. 14.

As shown in FIG. 13, the internal clock signals PCLK0 and PCLK1 are supplied to two-input NAND gate circuits G40 and G41. After being wired-OR connected, the output signals of the NAND gate circuits G40 and G41 are supplied to an inverter circuit G44. As a result, the inverter circuit G44 outputs the internal clock signal PCLK4, which is generated by combining the internal clock signals PCLK0 and PCLK1. The NAND gate circuits G40 and G41 are logically the same circuit. However, the input positions for two N-channel MOS transistors, which are connected in series between an output node and a ground power line, are opposite to each other. The reason why the input positions are opposite to each other is to match the following timings: a timing from when an edge of the internal clock signal PCLK0 is input until an edge of the internal clock signal PCLK4 is output; and a timing from when an edge of the internal clock signal PCLK1 is input until an edge of the internal clock signal PCLK4 is output.

The internal clock signals PCLK2 and PCLK3 are supplied to two-input NAND gate circuits G42 and G43, and are output as the internal clock signal PCLK5 from the inverter circuit G45.

The internal clock signals PCLK4 and PCLK5 are supplied to two-input NAND gate circuits G46 and G47. After being wired-OR connected, the output signals of the NAND gate circuits G46 and G47 are output as the internal clock signal PCLKD. The NAND gate circuits G46 and G47 are logically the same circuit. However, the input positions for two N-channel MOS transistors, which are connected in series between an output node and a ground power line, are opposite to each other. The reason why the input positions are opposite to each other is the same as that described above.

According to the circuit configuration described above, as shown in FIG. 14, the internal clock signal PCLKD is turned into a single phase, and is restored so as to have the same frequency as that of the internal clock signal CLK. The internal clock signal PCLKD that is generated as described above is supplied to the strobe circuit 80 shown in FIG. 3. The strobe circuit 80 includes the internal data strobe signal generation circuit 400 and the skew detection circuit 500.

Figure 15:
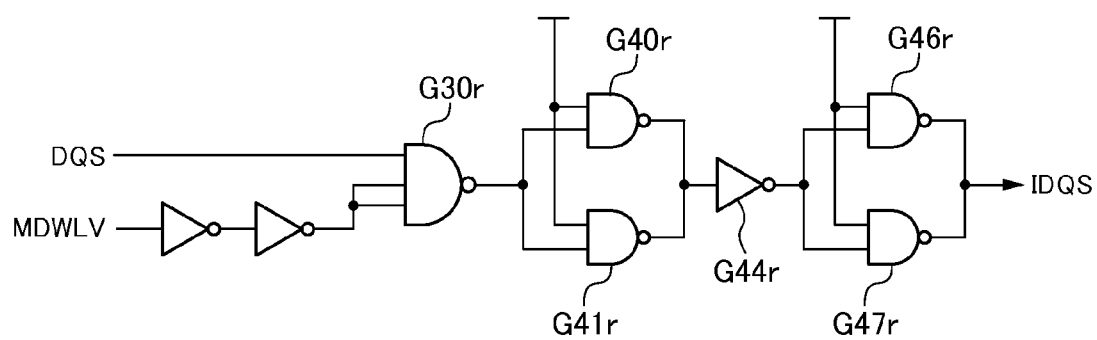
FIG. 15 is a circuit diagram indicative of an internal data strobe signal generation circuit shown in FIG. 3.

Turning to FIG. 15, the internal data strobe signal generation circuit 400 includes a three-input NAND gate circuit G30r. To the first input node of the NAND gate circuit G30r, the external data strobe signal DQS is supplied. To the second and third input nodes, the enable signal MDWLV is supplied. The NAND gate circuit G30r is a replica of the NAND gate circuit G30 shown in FIG. 13. Accordingly, the fan-out of the NAND gate circuit G30r is so designed as to be substantially equal to the fan-out of the NAND gate circuit G30.

An output signal of the NAND gate circuit G30r is supplied to two-input NAND gate circuits G40r and G41r. After being wired-OR connected, output signals of the NAND gate circuits G40r and G41r are supplied to an inverter circuit G44r. The other input nodes of the NAND gate circuits G40r and G41r are fixed to a high level. The NAND gate circuits G40r and G41r are replicas of the NAND gate circuits G40 and G41 shown in FIG. 13. Accordingly, the fan-out of the NAND gate circuits G40r and G41r are so designed as to be substantially equal to the fan-out of the NAND gate circuits G40 and G41. Similarly, the inverter circuit G44r is a replica of the inverter circuit G44 shown in FIG. 13. Accordingly, the fan-out of the inverter circuit G44r is so designed as to be substantially equal to the fan-out of the inverter circuit G44.

An output signal of the inverter circuit G44r is supplied to two-input NAND gate circuits G46r and G47r. After being wired-OR connected, output signals of the NAND gate circuits G46r and G47r are used as the internal data strobe signal IDQS. The other input nodes of the NAND gate circuits G46r and G47r are fixed to a high level. The NAND gate circuits G46r and G47r are replicas of the NAND gate circuits G46 and G47 shown in FIG. 13. Accordingly, the fan-out of the NAND gate circuits G46r and G47r are so designed as to be substantially equal to the fan-out of the NAND gate circuits G46 and G47.

In that manner, the internal data strobe signal generation circuit 400 includes the logic gates the number of which is the same as signal paths of the multiplier circuit 200, and the fan-outs of the corresponding gate circuits are so designed as to be substantially equal to each other. Therefore, the amount of delay that the multiplier circuit 200 has is substantially equal to the amount of delay that the internal data strobe signal generation circuit 400 has. That is, a period of time from when edges of the frequency-divided clock signals PCLKF0 to PCLKF3 and PCLKR0 to PCLKR3 are input into a plurality of input nodes of the multiplier circuit 200 until an edge of the internal clock signal PCLKD is output from an output node of the multiplier circuit 200 is substantially equal to a period of time from when an edge of the external data strobe signal DQS is input into an input node of the internal data strobe signal generation circuit 400 until an edge of the internal data strobe signal IDQS is output from an output node of the internal data strobe signal generation circuit 400.

Figure 16:
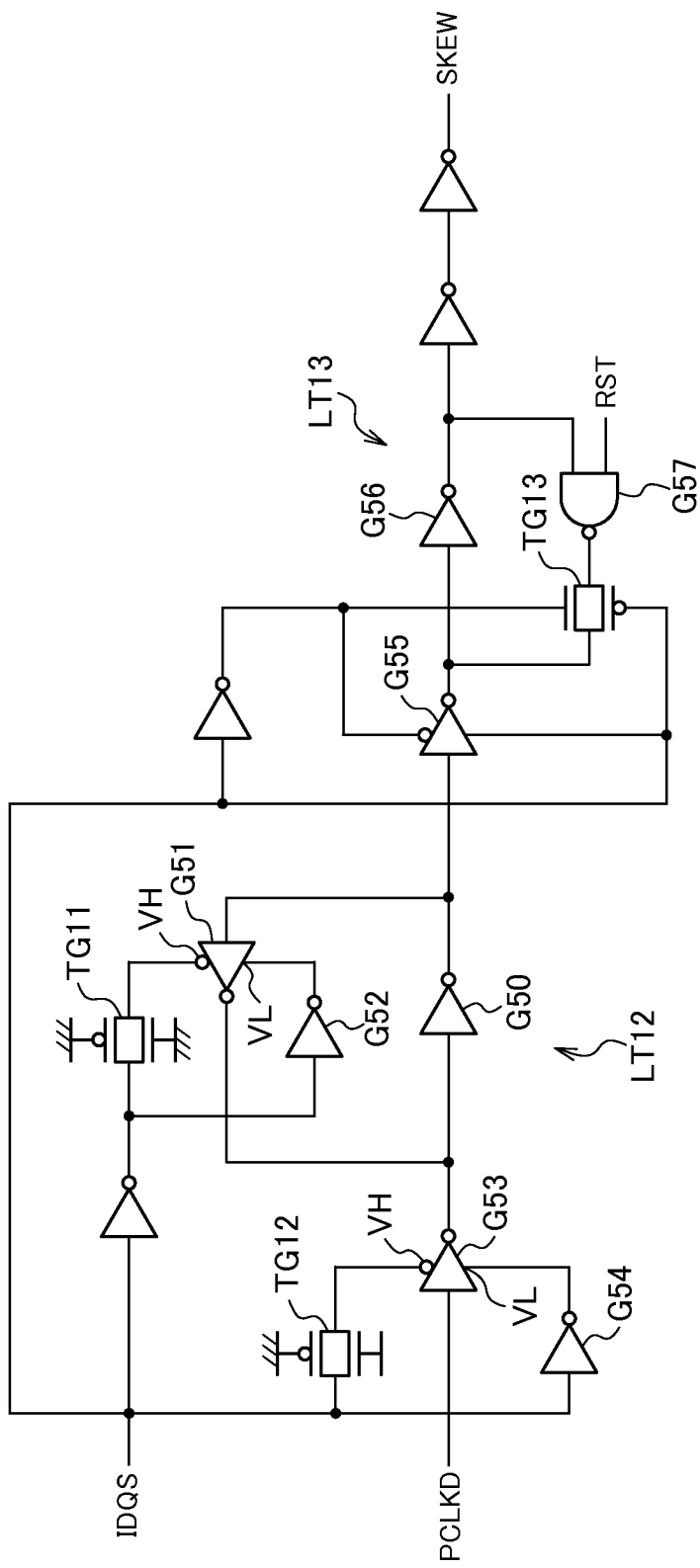
FIG. 16 is a circuit diagram indicative of a skew detection circuit shown in FIG. 3.

Turning to FIG. 16, the skew detection circuit 500 includes two latch circuits LT12 and LT13, which are connected in cascade. The latch circuit LT12 is so formed that an inverter circuit G50 and a clocked inverter circuit G51 are circularly connected. An operation of the clocked inverter circuit G51 is controlled by the internal data strobe signal IDQS. To a low-side control node VL of the clocked inverter circuit G51, the internal data strobe signal IDQS is supplied via an inverter circuit G52. To a high-side control node VH, the inverted internal data strobe signal IDQS is supplied via a transfer gate circuit TG11. The transfer gate circuit TG11 is always ON. The reason is that, with the delay by the inverter circuit G52 taken into consideration, the timing is so adjusted that a signal supplied to the low-side control node VL and a signal supplied to the high-side control node VH simultaneously change.

To an input node of the inverter circuit G50, the internal clock signal PCLKD is supplied via a clocked inverter circuit G53. To a low-side control node VL of the clocked inverter circuit G53, the inverted internal data strobe signal IDQS is supplied via an inverter circuit G54. To a high-side control node VH, the internal data strobe signal IDQS is supplied via a transfer gate circuit TG12. The transfer gate circuit TG12 is always ON. The reason is that, with the delay by the inverter circuit G54 taken into consideration, the timing is so adjusted that a signal supplied to the low-side control node VL and a signal supplied to the high-side control node VH simultaneously change.

An output signal of the inverter circuit G50 is supplied to the latch circuit LT13 via a clocked inverter circuit G55. The latch circuit LT13 is so formed that an inverter circuit G56 and a NAND gate circuit G57 are circularly connected. Between an output node of the NAND gate circuit G57 and an input node of the inverter circuit G56, a transfer gate circuit TG13 is connected. To the other input node of the NAND gate circuit G57, a reset signal RST is supplied. The clocked inverter circuit G55 and the transfer gate circuit TG13 are exclusively activated in synchronism with the internal data strobe signal IDQS.

According to the above configuration, during a period of time when the internal data strobe signal IDQS is at a low level, the clocked inverter circuit G53 is activated. However, since the clocked inverter circuit G55 is deactivated, the data held by the latch circuit LT13 is output as the skew detection signal SKEW. Meanwhile, during a period of time when the internal data strobe signal IDQS is at a high level, the clocked inverter circuit G53 is deactivated, while the clocked inverter circuit G55 becomes activated. Accordingly, the logic level of the internal clock signal PCLKD at a time when the internal data strobe signal IDQS is changed from a low level to a high level determines the logic level of the skew detection signal SKEW.

Figure 17:
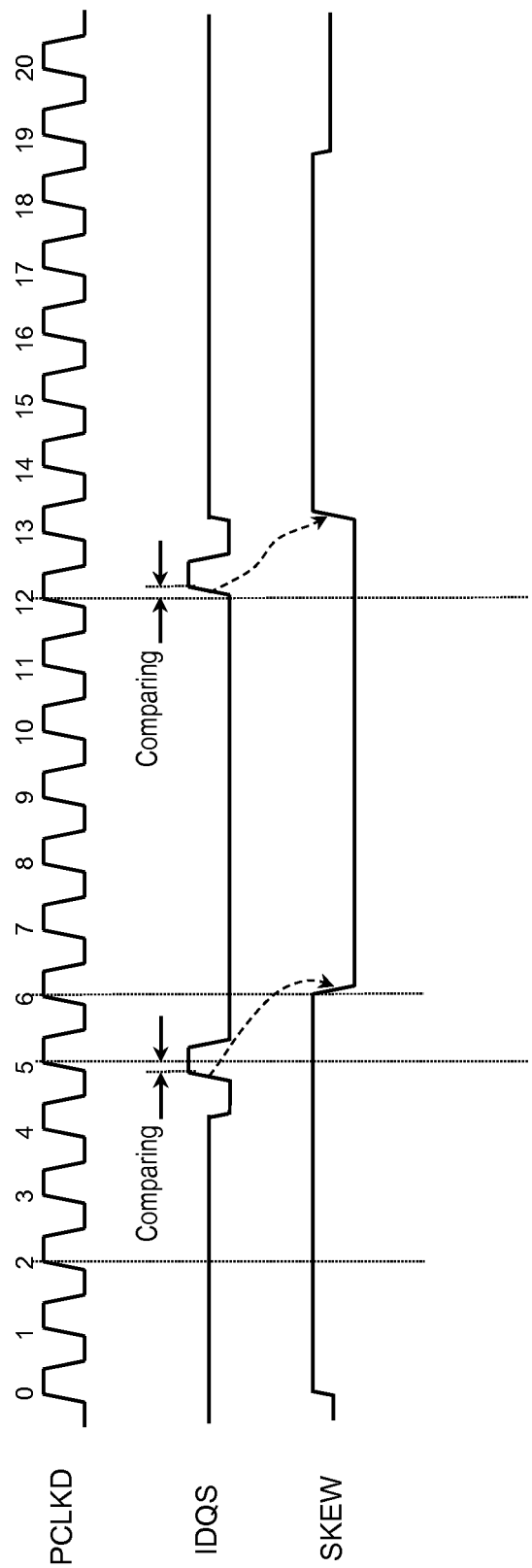
FIG. 17 is a timing chart indicative of an operation of the skew detection circuit shown in FIG. 16.

Turning to FIG. 17, in this example, with rising edges #5 and #12 of the internal clock signal PCLKD as targets, the internal data strobe signal IDQS is changed from a low level to a high level. At the rising edge #5 of the internal clock signal PCLKD, the internal data strobe signal IDQS is changed to a high level earlier than the internal clock signal PCLKD. Therefore, the skew detection signal SKEW is at a low level. At the rising edge #12 of the internal clock signal PCLKD, the internal clock signal PCLKD is changed to a high level earlier than the internal data strobe signal IDQS. Therefore, the skew detection signal SKEW is at a high level.

If the timing at which the skew detection signal SKEW is switched is discovered by gradually changing the change timing of the internal data strobe signal IDQS, the skew between both signals can be substantially zero. In that manner, the write leveling operation is performed.

In this case, the internal clock signal PCLKD is delayed by the multiplier circuit 200, relative to the frequency-divided clock signals PCLKF0 to PCLKF3 and PCLKR0 to PCLKR3. However, according to the present embodiment, the internal data strobe signal IDQS is delayed by the internal data strobe signal generation circuit 400, relative to the external data strobe signal DQS. Moreover, the amount of delay by the multiplier circuit 200 is substantially equal to the amount of delay by the internal data strobe signal generation circuit 400. Therefore, when the above-described write leveling operation is performed, the skew between the frequency-divided clock signals PCLKF0 to PCLKF3 and PCLKR0 to PCLKR3 and the external data strobe signal DQS can be substantially zero. In that manner, an offset during the write leveling operation that is attributable to the amount of delay by the multiplier circuit 200 is cancelled. Thus, the accurate write leveling operation is possible.

It is apparent that the present invention is not limited to the above embodiments, but may be modified and changed without departing from the scope and spirit of the invention.

Volatile memories, non-volatile memories, or mixtures of them can be applied to the memory cells of the present invention.

The technical concept of the present invention can be applied to a semiconductor device having a signal transmission circuit. The forms of the circuits in the circuit blocks disclosed in the drawings and other circuits for generating the control signals are not limited to the circuit forms disclosed in the embodiments.

The technical concept of the present invention can be applied to a general semiconductor device such as a CPU (Central Processing Unit), an MCU (Micro Control Unit), a DSP (Digital Signal Processor), an ASIC (Application Specific Integrated Circuit), an ASSP (Application Specific Standard Product), and a memory. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, a PMOS transistor (P-channel MOS transistor) is a representative example of a first conductive transistor, and an NMOS transistor (N-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following data processing systems:

A1. A data processing system comprising:
a first semiconductor device; and
a second semiconductor device connected to the first semiconductor device,
wherein the first semiconductor device includes:
a strobe signal generation circuit supplied with a first data strobe signal to generate a second data strobe signal supplied from the second semiconductor device, the second data strobe signal is activated after elapse of a first period of time since the first data strobe signal that is supplied to the strobe signal generation circuit is activated;
an input buffer circuit receiving a plurality of write data in serial from the second semiconductor device in synchronism with the second data strobe signal;
a multiplier circuit that multiplies a plurality of first clock signals to generate a second clock signal, the second clock signal is activated after elapse of a second period of time since each of the first clock signals that is supplied to the multiplier circuit is activated;
a serial-to-parallel conversion circuit that converts the write data that are output from the input buffer circuit in serial into parallel in synchronism with the first clock signals; and
a skew detection circuit measuring a skew between the second clock signal and the second data strobe signal, and
the second period of time is substantially the same as the first period of time.

A2. The data processing system as A1, wherein
the multiplier circuit includes a plurality of first input nodes each supplied with an associated one of the first clock signals and a first output node from which the second clock signal is output,
the strobe signal generation circuit includes a second input node supplied with the first data strobe signal and a second output node from which the second data strobe signal is output, and
a number of first logic gate circuits connected between each of the first input nodes and the first output node is equal to a number of second logic gate circuits connected between the second input node and the second output node.

A3. The data processing system as A2, wherein each of the first logic gate circuits has substantially the same fan-out as an associated one of the second logic gate circuits.

What is claimed is:

1. A semiconductor device comprising:
a clock terminal supplied with a first clock signal from outside;
a dividing circuit dividing a frequency of the first clock signal to generate a plurality of second clock signals that are different in phase from one another;
a multiplier circuit multiplying the second clock signals to generate a third clock signal, the multiplexer having a predetermined operating delay time;
a data strobe terminal supplied with a first data strobe signal from outside;
a strobe signal generation circuit adding the predetermined operating delay time to the first data strobe signal to generate a second data strobe signal; and
a skew detection circuit measuring a skew between the third clock signal and the second data strobe signal.

2. The semiconductor device as claimed in claim 1, wherein
the multiplier circuit includes a plurality of first input nodes each supplied with an associated one of the second clock signals and a first output node from which the third clock signal is output,
the strobe signal generation circuit includes a second input node supplied with the first data strobe signal and a second output node from which the second data strobe signal is output, and
a number of first logic gate circuits connected between each of the first input nodes and the first output node is equal to a number of second logic gate circuits connected between the second input node and the second output node.

3. The semiconductor device as claimed in claim 2, wherein each of the first logic gate circuits has substantially the same fan-out as an associated one of the second logic gate circuits.

4. The semiconductor device as claimed in claim 1, wherein the clock terminal is disposed in a first pad region extending along a first side of the semiconductor device, and the data strobe terminal is disposed in a second pad region extending along a second side of the semiconductor device that is different from the first side.

5. The semiconductor device as claimed in claim 4, further comprising a memory cell array including a plurality of memory cells, wherein
the frequency dividing circuit is disposed in a first peripheral circuit region that locates along the first pad region,
the strobe signal generation circuit and the skew detection circuit are disposed in a second peripheral circuit region that locates along the second pad region, and
the memory cell array is sandwiched between the first and second peripheral circuit regions.

6. The semiconductor device as claimed in claim 1, further comprising an input buffer circuit that receives a plurality of write data supplied from outside in synchronism with the second data strobe signal.

7. The semiconductor device as claimed in claim 6, further comprising a serial-to-parallel conversion circuit that converts the write data that are output from the input buffer circuit in serial into parallel in synchronism with the second clock signals.

8. A semiconductor device comprising:
   a strobe signal generation circuit supplied with a first data strobe signal to generate a second data strobe signal supplied from outside, the second data strobe signal is activated after elapse of a first period of time since the first data strobe signal that is supplied to the strobe signal generation circuit is activated;
   an input buffer circuit receiving a plurality of write data in serial from outside in synchronism with the second data strobe signal;
   a multiplier circuit that multiplies a plurality of first clock signals to generate a second clock signal, the second clock signal is activated after elapse of a second period of time since each of the first clock signals that is supplied to the multiplier circuit is activated;
   a serial-to-parallel conversion circuit that converts the write data that are output from the input buffer circuit in serial into parallel in synchronism with the first clock signals; and
   a skew detection circuit measuring a skew between the second clock signal and the second data strobe signal,
   wherein the second period of time is substantially the same as the first period of time.

9. The semiconductor device as claimed in claim 8, wherein
   the multiplier circuit includes a plurality of first input nodes each supplied with an associated one of the first clock signals and a first output node from which the second clock signal is output,
   the strobe signal generation circuit includes a second input node supplied with the first data strobe signal and a second output node from which the second data strobe signal is output, and
   a number of first logic gate circuits connected between each of the first input nodes and the first output node is equal to a number of second logic gate circuits connected between the second input node and the second output node.

10. The semiconductor device as claimed in claim 9, wherein each of the first logic gate circuits has substantially the same fan-out as an associated one of the second logic gate circuits.

11. The semiconductor device as claimed in claim 8, wherein the first clock signals are not phase-controlled with respect to an external clock signal supplied from outside.

12. A data processing system comprising:
   a first semiconductor device; and
   a second semiconductor device connected to the first semiconductor device,
   wherein the first semiconductor device includes:
      a clock terminal supplied with a first clock signal from the second semiconductor device;
      a dividing circuit dividing a frequency of the first clock signal to generate a plurality of second clock signals that are different in phase from one another;
      a multiplier circuit multiplying the second clock signals to generate a third clock signal, the multiplexer having a predetermined operating delay time;
      a data strobe terminal supplied with a first data strobe signal from the second semiconductor device;
      a strobe signal generation circuit adding the predetermined operating delay time to the first data strobe signal to generate a second data strobe signal; and
      a skew detection circuit measuring a skew between the third clock signal and the second data strobe signal.

13. The data processing system as claimed in claim 12, wherein
   the multiplier circuit includes a plurality of first input nodes each supplied with an associated one of the second clock signals and a first output node from which the third clock signal is output,
   the strobe signal generation circuit includes a second input node supplied with the first data strobe signal and a second output node from which the second data strobe signal is output, and
   a number of first logic gate circuits connected between each of the first input nodes and the first output node is equal to a number of second logic gate circuits connected between the second input node and the second output node.

14. The data processing system as claimed in claim 13, wherein each of the first logic gate circuits has substantially the same fan-out as an associated one of the second logic gate circuits.

* * * * *